(12) United States Patent
Tegen

(10) Patent No.: US 7,291,532 B2
(45) Date of Patent: Nov. 6, 2007

(54) LOW RESISTANCE CONTACT IN A SEMICONDUCTOR DEVICE

(75) Inventor: Stefan Tegen, Dresden (DE)

(73) Assignee: Infineon Technologies AG, Munich (DE)

( * ) Notice: Subject to any disclaimer, the term of this patent is extended or adjusted under 35 U.S.C. 154(b) by 104 days.

(21) Appl. No.: 11/184,074

(22) Filed: Jul. 19, 2005

(65) Prior Publication Data

US 2007/0020905 A1 Jan. 25, 2007

(51) Int. Cl.
*H01L 21/8242* (2006.01)
(52) U.S. Cl. ............... 438/256; 438/666; 257/E21.627
(58) Field of Classification Search ............... 438/256, 438/666; 257/E21.627
See application file for complete search history.

(56) References Cited

U.S. PATENT DOCUMENTS 6,827,869 B2 * 12/2004 Podlesnik et al. ............. 216/17
6,979,652 B2 * 12/2005 Khan et al. ................. 438/700

FOREIGN PATENT DOCUMENTS

JP 61032569 A * 2/1986

* cited by examiner

*Primary Examiner*—Asok K. Sarkar
*Assistant Examiner*—Emily Rohm
(74) *Attorney, Agent, or Firm*—Patterson & Sheridan, L.L.P.

(57) ABSTRACT

In a method for manufacturing a contact electrically contacting an electrically conductive silicon structure, a substrate with a surface is provided, the substrate having the silicon structure at the surface. Silicon oxide is grown selectively on at least part of the silicon structure. A layer is produced over the surface and the silicon oxide and an opening is produced in the layer, the opening abutting on the silicon oxide. The selectively grown silicon oxide is removed and the opening is filled with electrically conductive material, whereby the electrically conductive material forms the contact.

17 Claims, 8 Drawing Sheets

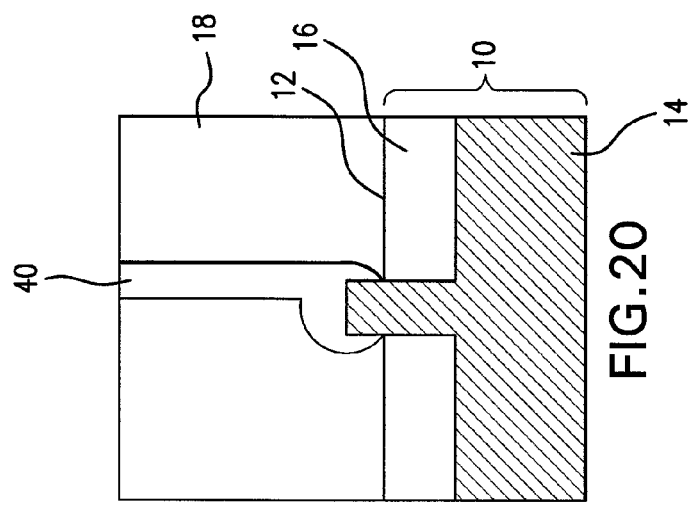
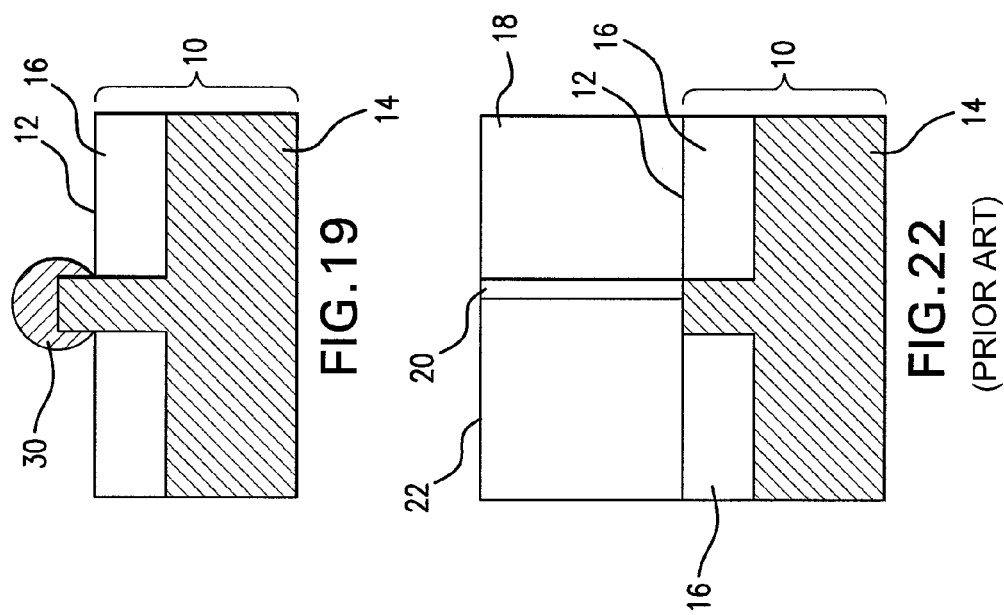

LOW RESISTANCE CONTACT IN A SEMICONDUCTOR DEVICE

TECHNICAL FIELD OF THE INVENTION

The present invention relates to a contact in a microelectronic device and a method for manufacturing the contact. More particularly, the present invention relates to an electrically highly conductive joint between the contact and an electrically conductive structure in the device.

BACKGROUND OF THE INVENTION

A contact according to the state of the art is displayed in FIG. 22 in a cross-sectional view. A substrate 10 has a surface 12 and an electrically conductive structure 14. The conductive structure 14 partly abuts on the surface 12. Hence a part of the surface 12 of the substrate 10 is formed by the material of the electrically conductive structure 14. Other parts of the surface 12 are formed by other materials such as an electrically insulating material of a shallow trench isolation 16. Over the surface 12 of the substrate 10, a layer 18 is disposed which is typically made from electrically insulating material. A contact 20 penetrates the layer 18 and abuts on the conductive structure 14. In other words, the contact 20 made from electrically conductive material reaches from the layer's 18 surface 22 facing away from the substrate 10 to the region of the surface 12 of the substrate 10 in which the conductive structure 14 is exposed.

The conventional design of the contact 20 displayed in FIG. 22 provides several drawbacks. In particular, since the number of short circuit defects in the layer 18 (caused during the steps of lithography and etching) rises with increasing size of each contact 20, a small cross-sectional area of the contact 20 is advantageous and desired. On the other hand, the cross-sectional area of the contact 20 determines the size of the interface between the contact 20 and the conductive structure 14. However, a small interface causes a high transitional resistance. In particular, when a diffusion inhibiting layer is provided between the contact 20 and the conductive structure 14 in order to inhibit the diffusion of dopants between both, the transition resistance caused by this additional layer is considerable and is aimed to be reduced by increasing the interface.

Another problem of the design displayed in FIG. 22 is that a lateral offset of the contact 20 with respect to the conductive structure 14 may easily result in a further reduced size of the interface between the contact 20 and the conductive structure 14. In FIG. 22, the contact 20 is not centred with respect to the conductive structure 14. It can easily be seen that any further increase of the lateral offset will reduce the size of the interface and increase the transition resistance between the contact 20 and the conductive structure 14.

SUMMARY OF THE INVENTION

The present invention provides a method for manufacturing a contact electrically contacting an electrically conductive structure and to provide a microelectronic device with a contact electrically contacting an electrically conductive structure with a low transitional resistance between the contact and the structure. The present invention also provides a low number of short circuit defects. Additionally, the present invention provides a resistance largely independent from a lateral offset between the contact and the conductive structure. Also, the present invention provides a simple method for manufacturing a contact and to provide a microelectronic device which can be simply manufactured.

In one embodiment of the invention, there is a method for manufacturing a contact electrically contacting an electrically conductive silicon structure, the method including providing a substrate with a surface, the substrate having the silicon structure at the surface; selectively growing silicon oxide on at least part of the silicon structure; producing a layer over the surface and the silicon oxide; producing an opening in the layer, the opening abutting on the silicon oxide; removing the selectively grown silicon oxide; and filling the opening with electrically conductive material, whereby the electrically conductive material forms the contact.

In another embodiment, the present invention is a method for manufacturing a contact electrically contacting an electrically conductive structure, the method comprising providing a substrate with a surface, the substrate having the electrically conductive structure at the surface, the electrically conductive structure comprising a first material; selectively growing a second material on at least part of the electrically conductive structure; producing a layer over the surface and the second material; producing an opening in the layer, said opening abutting on the second material; removing the second material, and filling the opening with electrically conductive third material, whereby the third material forms the contact.

In still another embodiment, the present invention is a microelectronic device comprising a substrate with a surface; an electrically conductive structure at the surface; a layer over the electrically conductive structure and the substrate; and a contact, the contact penetrating the layer and one end of the contact electrically contacting the electrically conductive structure, wherein the cross sectional area of the contact is enlarged at the one end of the electrically conductive structure.

In yet another embodiment, the present invention provides a contact having a small cross-sectional area with a base, or lower end, having an increased cross-sectional area and abutting on a conductive structure wherein the increased cross-sectional area of the base corresponds to an increased size of the interface between the contact or its base, respectively, and the conductive structure. In one aspect, the present invention produces the enlarged base by a self-aligning method. In particular, a material is grown self-aligned on at least part of the conductive structure, thereby forming an auxiliary structure. This auxiliary structure is later on removed and replaced by a conductive material. The present invention is particularly useful for an electrically conductive silicon structure. On exposed surfaces of this silicon structure, silicon dioxide is easily grown as the auxiliary structure.

The present invention and many of its embodiments provide one or several of the subsequently described advantages. In particular, preferred embodiments of the present invention provide an enlarged interface and hence reduced transition resistance between a contact and the conductive structure; a reduced influence of a lateral offset; simple manufacturing due to the use of the self-aligning technique; applicability to a broad variety of microelectronic devices; and compatibility with conventional manufacturing processes.

BRIEF DESCRIPTION OF THE INVENTION

The present invention will become clear from the following description taken in conjunction with the accompanying drawings in which:

FIGS. 19 and 20 are schematic cross-sectional views of a microelectronic device according to another embodiment during a manufacturing process according to another embodiment of the present invention.

FIG. 22 is a schematic cross-sectional view of a conventional microelectronic device.

DETAILED DESCRIPTION OF THE INVENTION

FIGS. 1 to 6 are schematic views of a vertical cross-section of a microelectronic device according to a first embodiment of the present invention during a manufacturing process according to another embodiment of the present invention.

Figure 1:
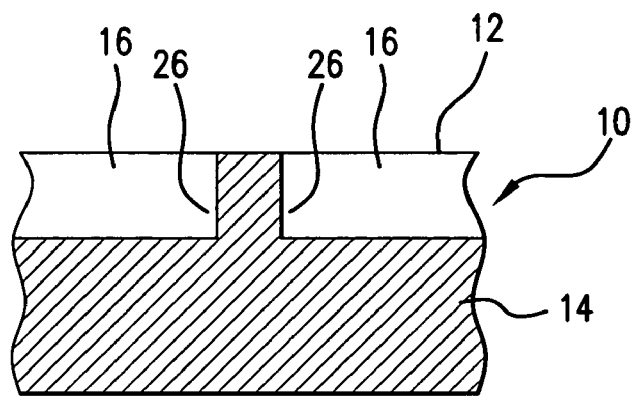
FIGS. 1 to 6 are schematic cross-sectional views of a microelectronic device according to the present invention during a manufacturing process according to the present invention.

Referring to FIG. 1, a substrate 10 with a surface 12 and an electrically conductive structure 14 is provided, the electrically conductive structure 14 partly abutting on the surface 12. In this example, the substrate 10 comprises silicon or any other semiconductor (e.g. Ge, GaAs etc.), forming the electrically conductive structure 14. Further parts of the substrate 10 such as glass or $Al_2O_3$ layers may be comprised, as well, but are not displayed in FIGS. 1 to 6. The electrically conductive structure 14 abuts on a part of the surface 12. Other parts of the surface 12 are formed by a shallow trench isolation STI 16 comprising an electrically insulating material in a number of trenches 26. In other words, the substrate 10 displayed in FIG. 1 has been produced by etching shallow trenches 26 into the surface 12 of the substrate 10 and filling the trenches with electrically insulating material such that part of the surface 12 is formed by the electrically conductive structure 14 and other parts are formed by the shallow trench isolation 16. It is to be noted, however, that the present invention may be applied to any structure 14 at least partly abutting on the surface 12 of a substrate 10, regardless of the material and the method of manufacturing of the structure 14 and the substrate 10.

Figure 2:
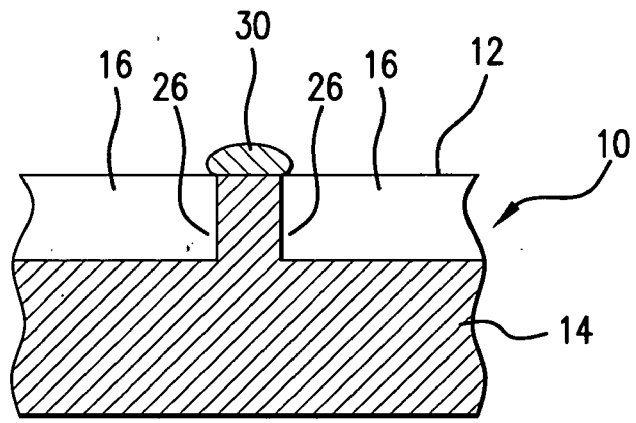
Figure 3:
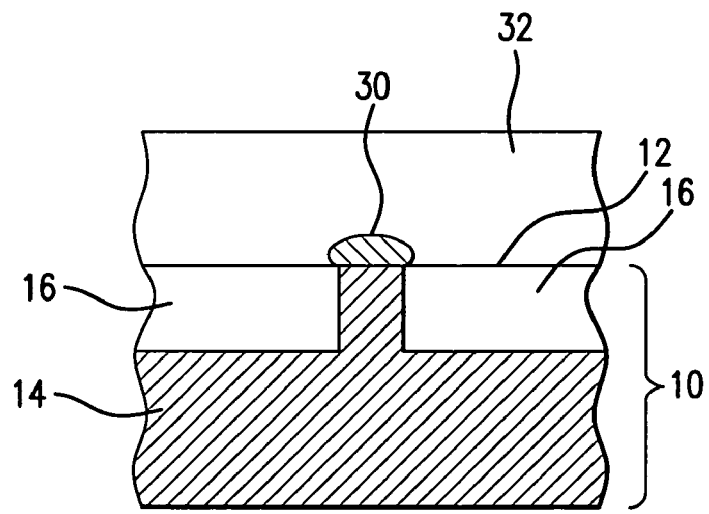
Figure 4:
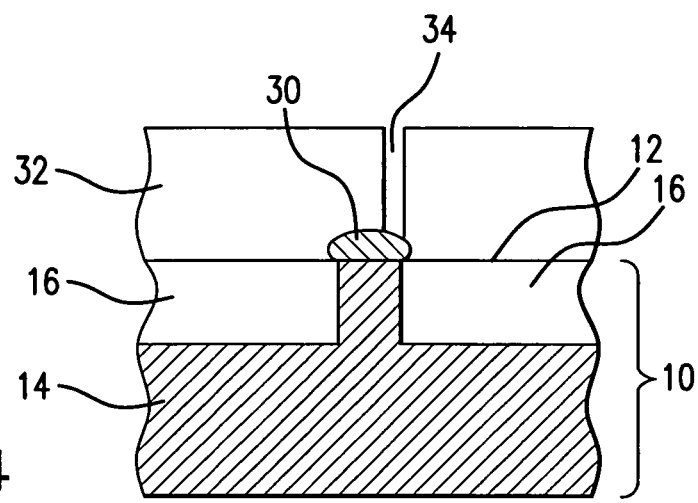

Referring to FIG. 2, a silicon oxide cap 30 is grown on the exposed surface part of the electrically conductive structure 14. This is preferably carried out by heating the substrate 10 to an elevated temperature of several hundreds of degrees C. and exposing it to oxygen or to another oxidizing atmosphere. The thickness of the silicon oxide cap 30 depends on the oxidizing atmosphere, its pressure, the time of exposure and the temperature. At least when the height or thickness of the silicon oxide cap 30 is not very small compared to its lateral dimensions, the cap is more or less dome-shaped which is preferred in the present invention. The edge of the cap may be characterized by a bulge as shown in FIGS. 2 to 4. Deviating from the slightly oversimplified Figures in the present invention, the growth of the cap 30 causes a wear of the silicon structure 14 and the resulting cap extends below the original surface 12.

Referring to FIG. 3, a layer 32 is produced over the surface 12 and the silicon oxide cap 30. The layer 32 may be homogeneous and made from a single material. Alternatively, the layer 32 has an inner structure as will e.g. be described below with reference to FIGS. 7 to 18. Although the layer 32 may comprise electrically conductive regions, it is to be noted that the present invention is particularly advantageous when the layer 32 comprises electrically insulating regions, as well. Preferably, at least the region close to and above the silicon oxide cap 30 is electrically insulating.

Referring to FIG. 4, an opening 34 is produced in the layer 32. The opening 34 vertically penetrates the layer 32 and abuts on the silicon oxide cap 30. Preferably, the opening 34 is essentially cylindrical or channel-shaped. As will become clear from the discussion below, a cross-sectional area (in a plane parallel to the surface 12) of the opening 34 is advantageously smaller or much smaller than the lateral extension of the silicon oxide cap 30. A high aspect ratio of the opening 34 as shown in FIG. 4 is easily produced by an anisotropic etching step. This etching may stop at the surface of the silicon oxide cap 30, as displayed in FIG. 4 or even wear away material of the silicon oxide cap 30.

Figure 5:
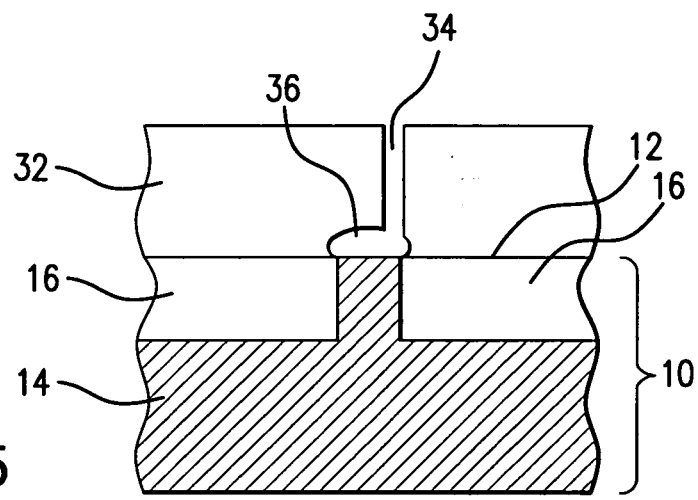

Referring to FIG. 5, the silicon oxide cap 30 is removed leaving a cavity 36 in place of the silicon oxide cap 30. This step is advantageously carried out by an isotropic etching process.

Figure 6:
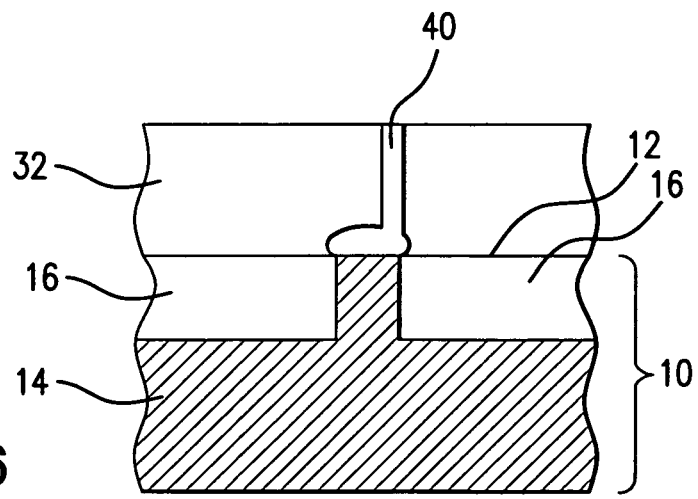

Referring to FIG. 6, the cavity 36 and the opening 34 are filled with an electrically conductive material thereby forming a contact 40.

As has already been described above, the manufacturing process described with respect to FIGS. 1 to 6 merely requires minor modifications of a standard production process. It is therefore easily implemented and causes low additional costs. These low costs are well justified by the advantages of the contact 40. In particular, the contact 40 according to the present invention combines a maximum interface with the conductive structure 14 and hence minimum transition resistance with a low cross-sectional area and hence a low number of short circuit defects in the whole microelectronic device.

Furthermore, the method has a high tolerance level regarding a lateral offset of the opening 34 with respect to the conductive structure 14. As can be easily seen from FIG. 6, up to a high level the offset does not influence a size of the interface of the contact 40 and the conductive structure 14 and the transition resistance.

FIGS. 7, 8, 10 and 13 are schematic top views and FIGS. 9, 11, 12 and 14 to 18 are schematic cross-sectional views of a microelectronic device according to another embodiment of the present invention in several different stages of a manufacturing process according to another embodiment of the present invention. The FIGS. 9, 11, 12 and 14 display schematic views of a cross-section along a vertical plane A-A indicated in FIGS. 8 and 13. FIGS. 15 to 18 display schematic views of a vertical section B-B indicated in FIG. 13.

Figure 7:
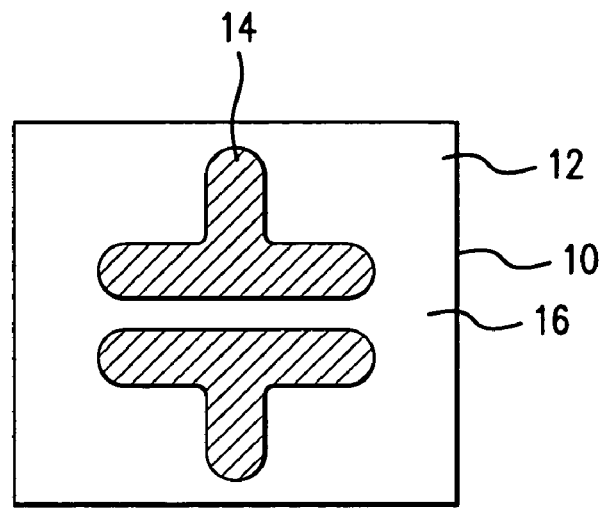
FIGS. 7 to 18 are schematic top views and cross-sectional views of a microelectronic device according to another embodiment of the present invention during a manufacturing process according to another embodiment of the present invention.

FIG. 7 is a schematic top view of a surface 12 of a substrate 10. A part of this surface 12 is formed by an electrically conductive structure 14 and other parts of the surface 12 are formed by a shallow trench isolation 16.

Figure 8:
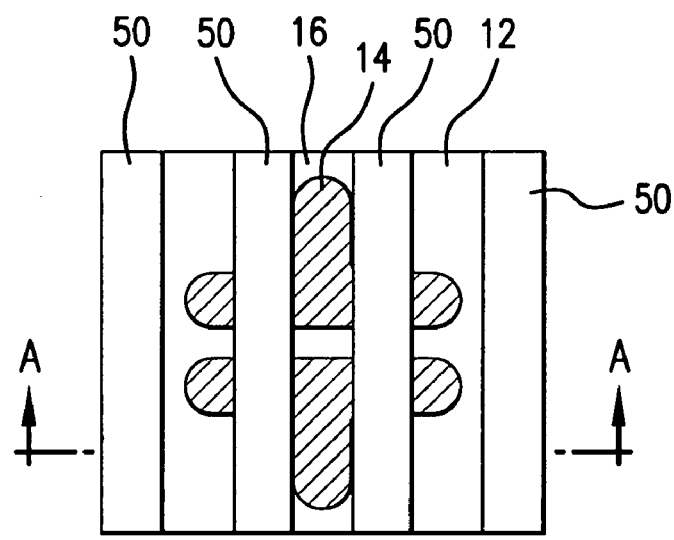
Figure 9:
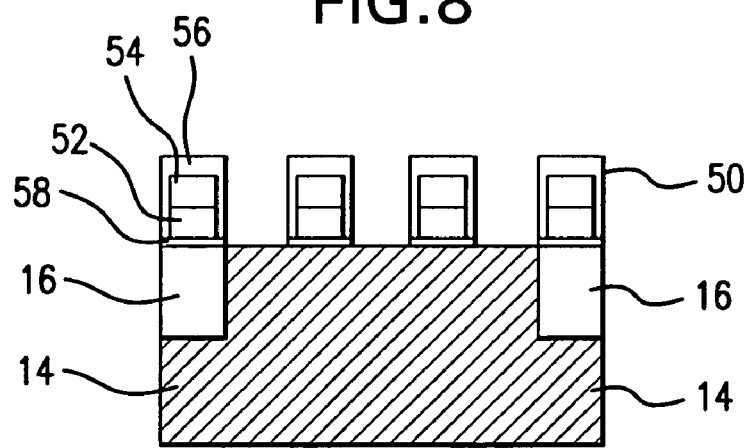

Referring to FIGS. 8 and 9, strip-like gate electrode structure 50 are produced on the surface 12 of the substrate 10. In this particular example, each gate electrode structure 50 consists of a polysilicon strip 52, a WSi-strip 54 and an electrically insulating material 56 on top of the WSi-strip 54 and on sidewalls of the polysilicon strip 52 and the WSi-strip 54. A thin electrically insulating film 58 is arranged between the surface 12 and the polysilicon strip 52 and electrically insulates the polysilicon strip 52 from the conductive structure 14.

Figure 10:
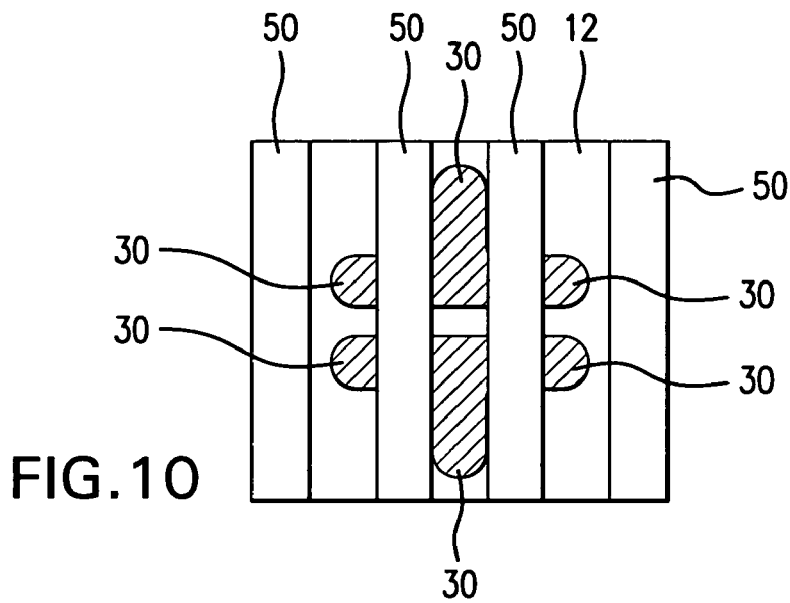
Figure 11:
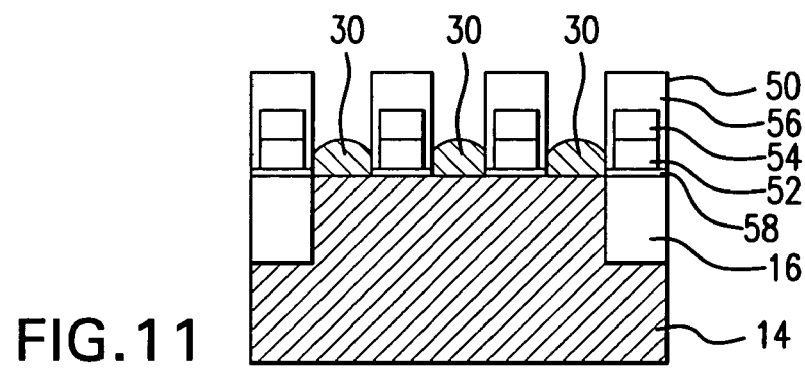

Referring to FIGS. 10 and 11, silicon oxide caps 30 are grown on top of the conductive structures 14 by a selective deposition process. The gate electrode structures 50 serve as a mask partially covering the electrically conductive structure 14. The growing process of the silicon oxide is selective insofar as the silicon oxide merely grows on silicon surfaces and does not grow on the electrically insulating material of the shallow trench isolation 16 or on the insulator 56 of the gate electrode structures 50. Therefore, the lateral extension of the silicon oxide caps 30 is predetermined by the lateral shape of the exposed surfaces of the conductive structure 14 and further limited by the gate electrode structure 50. The resulting feature of each silicon oxide cap is more or less dome-like with a convex upper surface, vertical sides abutting on the gate electrode structures 50.

Figure 12:
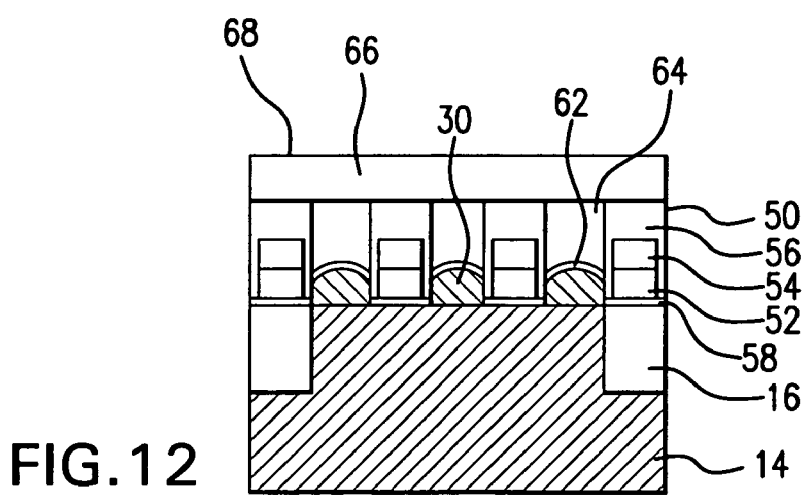

Referring to FIG. 12, the silicon oxide caps 30 are covered by thin nitride layers 62 which will be used as etch stops later on. Alternatively, the layers 62 are made from any other material which is suitable to provide an etch stop. Subsequently, the gaps between the gate electrode structures 50 which remain over the silicon oxide caps 30 and the nitride layers 62 are filled with a filling material 64. A top layer 66 with a flat surface 68 is produced, wherein the material of the top layer is equal to the filling material and both are produced in a single step. Alternatively, the material of the top layer is different from the filling material and both are deposited in two subsequent steps.

Figure 13:
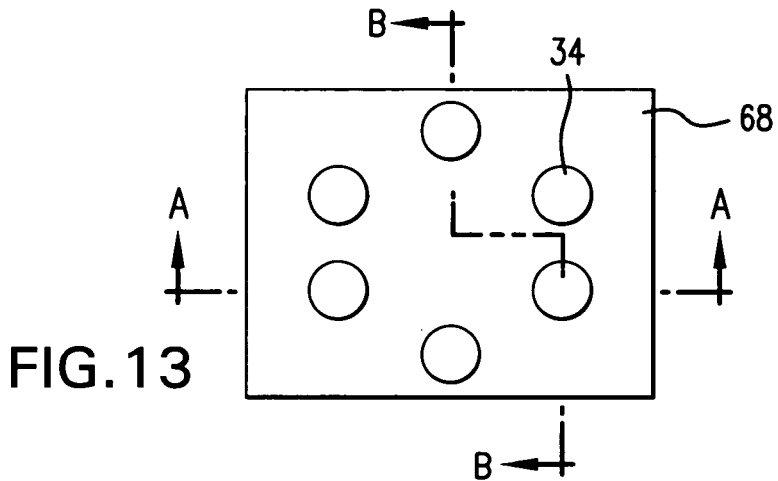
Figure 14:
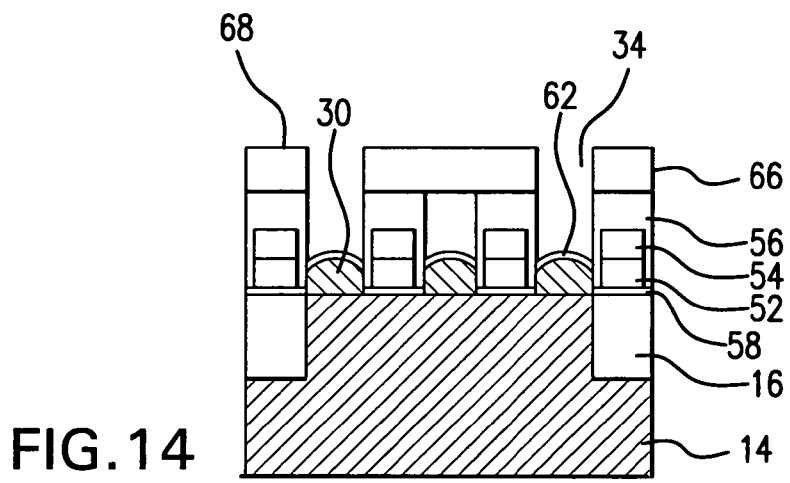
Figure 15:
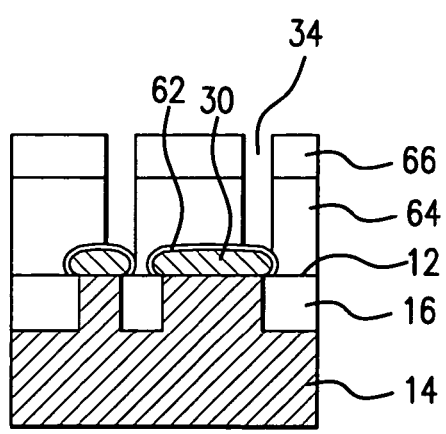

Referring to FIGS. 13 through 15, openings 34 are etched into the top layer 66 and the filling material 64. These openings 34 are preferably cylindrical or channel-like with a high aspect ratio, i.e. a high ratio of vertical depth and lateral width. Each opening 34 abuts on a silicon oxide cap 30. The nitride layer 62 provides an etch stop, i.e. the lower end of the opening 34 is defined by the nitride layer 62.

The etch step and the electrically insulating material 58 of the gate electrode structures 50 are preferably such that the insulating material 56 of the gate electrode structures 50 is not etched or etched by a considerably lower rate than the filling material 64. In this case, an offset of the openings 34 in a direction perpendicular to the gate electrode structures 50 is tolerated to some extent, as can be seen in FIG. 14.

Figure 16:
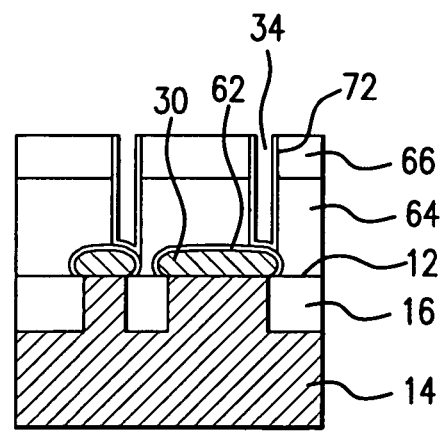

Referring to FIG. 16, the walls, particularly the sidewalls of the openings 34, are coated with another nitride layer 72. For this purpose, the deposition process should be as isotropic as possible.

Figure 17:
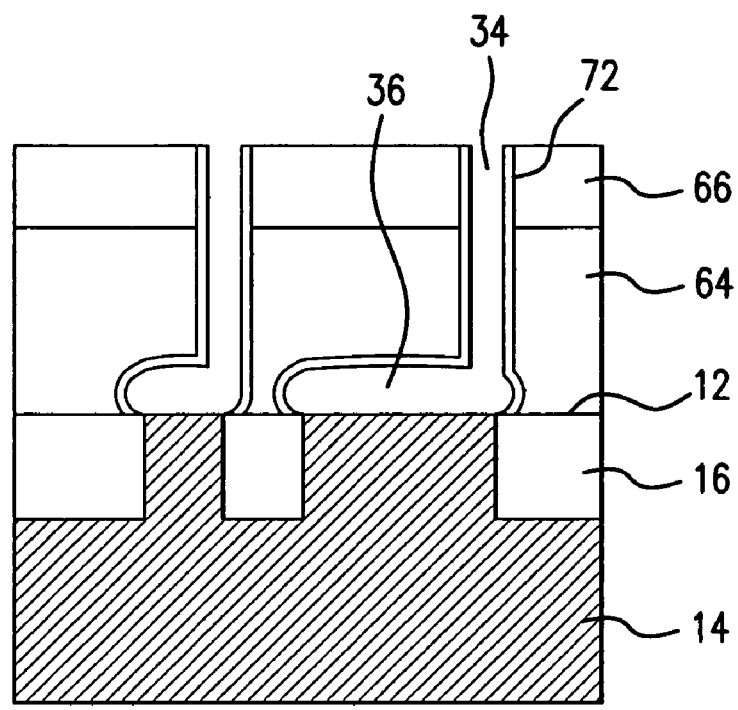

Referring to FIG. 17, any nitride layers between the opening 34 and the silicon oxide cap 30 are subsequently removed. The etching process used for this step should be as anisotropic as possible in order to prevent wear of the nitride layer 72 on the sidewalls of the openings 34. Subsequently, the silicon oxide of the silicon oxide cap is removed by an isotropic etching step whereby the nitride layers 62 and 72 protect the filling material 64 from wear. A cavity 36 remains in place of the silicon oxide cap 30.

Figure 18:
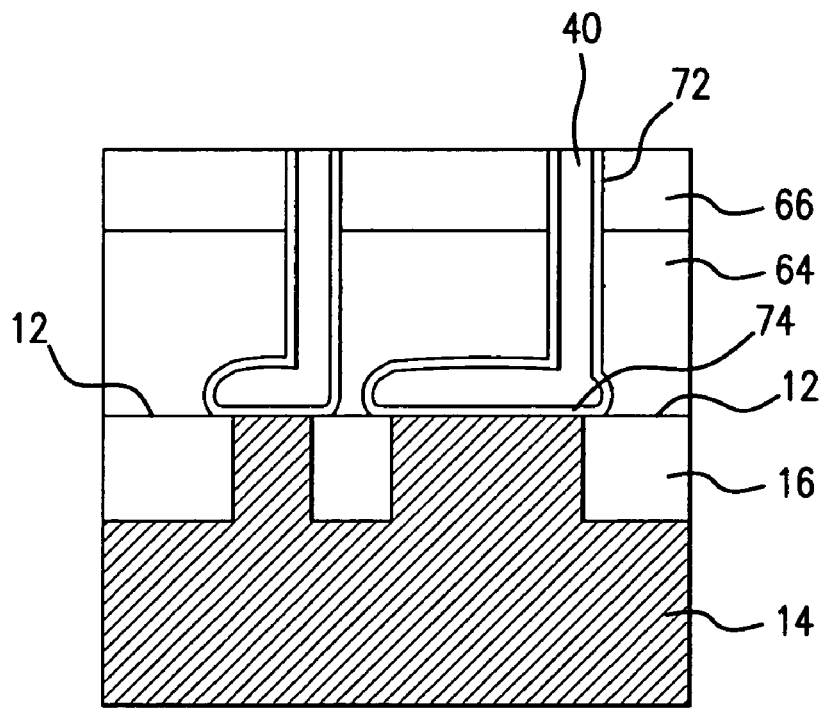

Referring to FIG. 18, another nitride layer 74 is deposited on the walls of the opening 34 and the cavity 36. In FIG. 18, for reasons of simplicity, this nitride layer is shown on the surface 12 only. Finally, the cavity 36 and the opening 34 are filled with doped polysilicon or any other conductive material, thereby forming a contact 40. The nitride layer 74 reduces diffusion of doping atoms from the doped polysilicon of the contact 40 to the conductive structure 14 or vice versa.

Whereas the particular geometry shown in FIGS. 7 to 18 is part of a stacked capacitor integrated memory circuit, the present invention can be advantageously applied to any microelectronic device with contacts contacting silicon structures. Furthermore, as already mentioned above, the present invention may be applied to electrically conductive structures made from Ge, GaAs or any other semiconductor or nonsemiconductor materials as long as any selective growing process selectively growing an auxiliary structure on exposed surfaces of the conductive structure exists, wherein the auxiliary structure is later on removed and replaced by electrically conductive material forming a contact.

Throughout this application, the term electrically conductive structure does not mean that the structure is permanently conductive or permanently conductive at a constant level. In the above-mentioned application of the invention to a stacked capacitor integrated memory device, the electrically conductive structure is an active area of cell transistors connecting storage capacitors to a bit line. In this application an electrically conductive channel is formed within the active area when a suitable voltage is applied to the corresponding gate electrode. The electrical conductivity of the active area may be very low at other gate voltages. As can be seen from this example, a permanent or high conductivity of the structure 14 is no prerequisite of the present invention. Rather, the present invention makes sense whenever the structure 14 provides electrical conductivity at least under certain conditions.

Many other variations of the embodiments described above with reference to FIGS. 1 to 18 are within the scope of the present invention, as well. In particular, instead of the gate electrode structures 50, any other kind of mask may be used and instead of the nitride layers 62, 72, 74, other material layers may be used advantageously as well. While doped polysilicon can be deposited very easily within the cavity 36, a metal or any other electrically conductive material may be used as well. Atomic layer deposition (ALD) methods are well suited to fill the cavity. The steps described above with respect to FIGS. 16 and 17, i.e. the deposition of another nitride layer 72 and the removal of the same between the opening 34 and the silicon oxide caps 30 are particularly useful when the chemical properties of the filling material 64 and/or of the top layer 66 are similar to the chemical properties of the auxiliary structure 30. In this case the nitride layer 72 prevents wear of the filling material 64 and the top layer 66 during the removal of the auxiliary structure 30. If an etching process exists which selectively removes the material of the auxiliary structure 30, but neither the filling material 64 nor the top layer 66, these steps described with reference to FIGS. 16 and 17 may be omitted.

A further modification of the above-described embodiments is shown in FIGS. 19 and 20. FIGS. 19 and 20 are schematic views of vertical cross-sections of a substrate 10 similar to the substrate of the first embodiment described above with reference to FIGS. 1 to 6. This embodiment differs from the first embodiment in that the electrically conductive structure 14 and the shallow trench isolation 16 do not form a flat surface 12. Rather, the exposed part of the electrically conductive structure 14 protrudes with respect to the surface plane of the shallow trench isolation 16. As a consequence, the silicon oxide cap 30 covers the top surface as well as the sidewalls of the protruding part of the electrically conductive structure 14. After the process steps of the first embodiment described above with reference to FIGS. 1 to 6, a contact 40 results with a further increased interface between the contact 40 and the electrically conductive structure 14.

Figure 21:
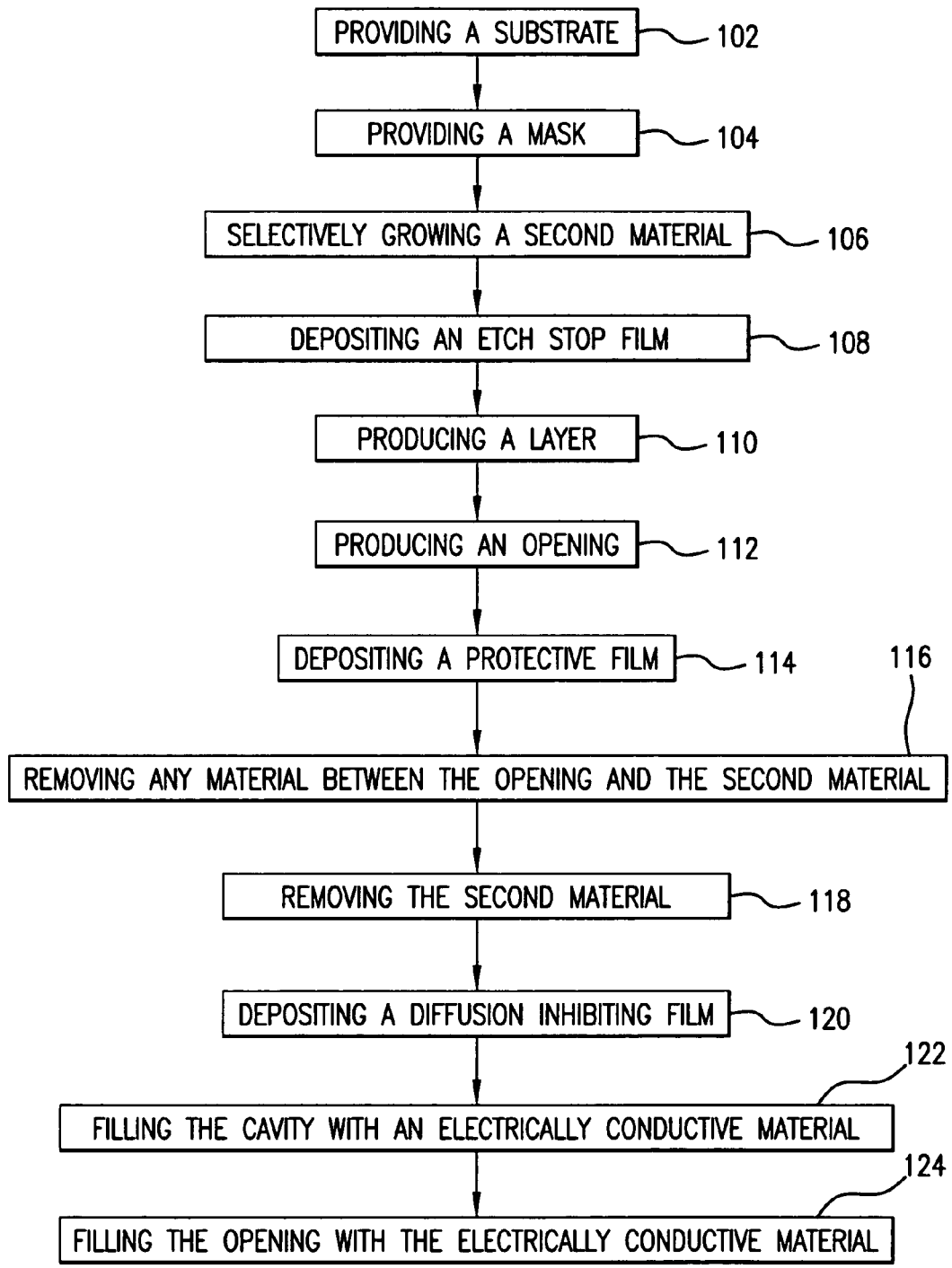
FIG. 21 is a schematic flow chart of a method according to the present invention.

FIG. 21 is a schematic flow chart of a method according to the present invention. In a first step 102 the substrate 10 with a surface 12 is provided, the substrate 10 having an electrically conductive structure 14 at the surface 12, the electrically conductive structure 14 comprising a first material (in the above embodiments: silicon). In a second step 104, the mask is provided on the surface 12 of the substrate 10 (in the above embodiments: the gate electrode structures 50). In a third step 106, a second material (in the above-described embodiments: silicon oxide) is selectively grown on exposed surfaces of the electrically conductive structure 14, i.e. on those parts neither covered by the mask nor by any other material. Thereby an auxiliary structure 30 is formed. In a fourth step 108, a first nitride film or any other etch stop film is deposited on the second material. This etch stop film later on provides an etch stop.

In a fifth step 110, a layer is produced over the surface 12 and the second material 30. In the first embodiment, this layer is the layer 32, in the second embodiment described above this layer may be identified with the filling material 64 and the top layer 66. In a sixth step 112, an opening 34 is produced in the layer. In a seventh step 114, a protective film 72 is deposited on sidewalls of the opening 34. In an eighth step 116, any material between the opening 34 and the second material 30 is removed. In the second embodiment described above, the nitride layers 62, 72 are removed as far as they are positioned between the opening 34 and the silicon oxide cap 30. In a ninth step 118, the selectively grown second material is removed whereby a cavity 36 remains instead. In a tenth step 120, a diffusion-inhibiting film 74 is deposited in the cavity 36. In an eleventh step 122 and a twelfth step 124, the cavity 36 and the opening 34 are filled with an electrically conductive material, thereby forming a contact 40. The eleventh step 122 and the twelfth step 124 are preferably conducted consecutively.

What is claimed is:

1. A method for manufacturing a contact electrically contacting an electrically conductive silicon structure, the method comprising:
   providing a substrate with a surface, the substrate having the silicon structure at the surface;
   selectively growing silicon oxide on at least part of the silicon structure;
   producing a layer over the surface and the silicon oxide;
   producing an opening in the layer, the opening abutting on the silicon oxide;
   removing the selectively grown silicon oxide; and
   filling the opening with electrically conductive material, wherein the electrically conductive material forms the contact.

2. The method according to claim 1, further comprising:
   providing a mask on the substrate, the mask defining the at least part of the silicon structure for selectively growing the silicon oxide.

3. The method according to claim 2, wherein
   the substrate comprises a second structure at its surface, the second structure comprising a material different from silicon, and
   the mask exposes the at least part of the silicon structure and at least part of the second structure.

4. The method according to claim 3, wherein the material of the second structure is silicon dioxide.

5. The method according to claim 3, wherein the second structure is a shallow trench isolation comprising an electrically insulating material in a trench.

6. The method according to claim 2, wherein
   the silicon structure is an active area of a field effect transistor, and
   the mask comprises a gate electrode of the field effect transistor.

7. The method according to claim 1, wherein
   a cavity is formed by removing the selectively grown silicon oxide, and
   filling the opening with the conductive material includes filling the cavity.

8. The method according to claim 7, wherein
   a nitride layer is deposited on the silicon structure in the cavity before filling the cavity.

9. The method according to claim 7, further comprising:
   depositing a first nitride film on the silicon oxide before producing the layer;
   depositing a second nitride film on side walls of a through hole; and
   removing the first nitride film exposed by the opening by a step of anisotropic etching, wherein
   the second nitride film is deposited and the first nitride film is removed before removing the silicon oxide, and
   the silicon oxide is removed by a step of essentially isotropically etching which is selective with respect to nitride.

10. The method according to claim 7, wherein the cavity is dome-shaped.

11. The method according to claim 1, wherein the conductive material is doped polycrystalline silicon.

12. A method for manufacturing a contact electrically contacting an electrically conductive structure, the method comprising:
   providing a substrate with a surface, the substrate having the electrically conductive structure at the surface, the electrically conductive structure comprising a first material;
   selectively growing a second material on at least part of the electrically conductive structure;
   producing a layer over the surface and the second material;
   producing an opening in the layer, the opening abutting on the second material;
   removing the second material; and
   filling the opening with electrically conductive third material, wherein the third material forms the contact.

13. The method according to claim 12, further comprising:
   providing a mask on the substrate, the mask defining the at least part of the electrically conductive structure for selectively growing the second material.

14. The method according to claim 13, wherein
   the substrate comprises a second structure at its surface, the second structure comprising a fourth material, the fourth material being different from the first material, and
   the mask exposes the at least part of the electrically conductive structure and at least part of the second structure.

15. The method according to claim 14, wherein the step of selectively growing comprises:
   exposing the at least part of the electrically conductive structure to a reactive gas, the reactive gas depositing the second material, wherein a rate of deposition on the first material is higher than a rate of deposition on the fourth material.

16. The method according to claim 13, wherein the electrically conductive structure is an active area of a field effect transistor; and the mask comprises a gate electrode of the field effect transistor.

17. The method according to claim 12, further comprising:

depositing a first protective film on the second material before producing the layer;

depositing a second protective film on side walls of the opening; and removing the first protective film exposed by the opening by a step of anisotropic etching, wherein the second protective film is deposited and the first protective film is removed before removing the second material, and the second material is removed by a step of essentially isotropically etching which is selective with respect to the second protective film.

* * * * *